United States Patent
Gill

(10) Patent No.: US 7,352,541 B2
(45) Date of Patent: Apr. 1, 2008

(54) CPP GMR USING FE BASED SYNTHETIC FREE LAYER

(75) Inventor: Hardayal Singh Gill, Palo Alto, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 421 days.

(21) Appl. No.: 10/837,358

(22) Filed: Apr. 30, 2004

(65) Prior Publication Data

US 2005/0243477 A1 Nov. 3, 2005

(51) Int. Cl.
G01B 5/39 (2006.01)
G01B 5/127 (2006.01)

(52) U.S. Cl. .................................. 360/324.12

(58) Field of Classification Search ........... 360/324.11, 360/324.12, 324.1, 324.2
See application file for complete search history.

(56) References Cited

U.S. PATENT DOCUMENTS

| | | | | |
|---|---|---|---|---|
| 5,134,533 A | | 7/1992 | Friedrich et al. ............ | 360/113 |
| 5,527,626 A | | 6/1996 | Gijs et al. .................... | 428/611 |
| 5,691,865 A | | 11/1997 | Johnson et al. ............. | 360/113 |
| 5,725,963 A | * | 3/1998 | Iwasaki et al. ............ | 428/811.2 |
| 6,205,008 B1 | | 3/2001 | Gijs et al. ................... | 360/324 |
| 6,473,275 B1 | * | 10/2002 | Gill ............................. | 360/314 |
| 6,819,532 B2 | * | 11/2004 | Kamijo ................... | 360/324.11 |
| 7,057,837 B2 | * | 6/2006 | Gill ............................. | 360/55 |
| 2001/0004307 A1 | * | 6/2001 | Saito et al. ............ | 360/324.12 |
| 2002/0085323 A1 | * | 7/2002 | Smith et al. ........... | 360/324.12 |
| 2002/0191348 A1 | * | 12/2002 | Hasegawa et al. .......... | 360/314 |
| 2003/0072111 A1 | * | 4/2003 | Hasegawa et al. ..... | 360/324.12 |
| 2003/0161077 A1 | | 8/2003 | Kawawake et al. ...... | 360/324.1 |
| 2003/0227723 A1 | | 12/2003 | Lei et al. ................ | 360/324.11 |
| 2003/0227724 A1 | * | 12/2003 | Li et al. ................. | 360/324.12 |
| 2004/0008454 A1 | * | 1/2004 | Gill ........................ | 360/324.12 |
| 2004/0218311 A1 | * | 11/2004 | Saito et al. .................. | 360/314 |

OTHER PUBLICATIONS

Parkin et al., "Oscillations in Exchange Coupling and Magnetoresistance in Metallic Superlattice Structures: Co/Ru, Co/Cr, and Fe/Cr", May 7, 1990, San Jose, California.

Baibich et al., "Giant Magnetoresistance of (001) Fe/(001) Cr Magnetic Superlattices", Nov. 21, 1988, Orsay, France.

* cited by examiner

Primary Examiner—William J Klimowicz
(74) Attorney, Agent, or Firm—Zilka-Kotab, PC

(57) ABSTRACT

A current perpendicular to plane (CPP) giant magnetoresistive (GMR) sensor having an antiparallel coupled free layer including a first magnetic layer of Fe and a second magnetic layer of FeXN, where X can be Al or Ta. The first and second magnetic layers of the free layer are separated from one another by a Cr coupling layer. The sensor may also include an antiparallel coupling layer including Fe magnetic layers separated by a Cr coupling layer. The pinned and free layers may be separated by a Cr spacer layer.

19 Claims, 4 Drawing Sheets

CPP GMR USING FE BASED SYNTHETIC FREE LAYER

FIELD OF THE INVENTION

The present invention relates to giant magnetoresistive (GMR) sensors and more particularly to a CPP GMR sensor having a synthetic free layer having magnetic layers comprising Fe and having Cr spacer layers and coupling layers.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of a rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

A spin valve sensor is characterized by a magnetoresistive (MR) coefficient that is substantially higher than the MR coefficient of an anisotropic magnetoresistive (AMR) sensor. For this reason a spin valve sensor is sometimes referred to as a giant magnetoresistive (GMR) sensor. When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Traditionally, the magnetization of a pinned layer has been fixed by exchange coupling one of the ferromagnetic layers (AP1) with a layer of antiferromagnetic material such as PtMn. While an antiferromagnetic material such as PtMn does not in and of itself have a magnetization, when exchange coupled with a magnetic material, it can strongly pin the magnetization of the ferromagnetic layer.

Sensors can also be categorized as current in plane (CIP) sensors or as current perpendicular to plane (CPP) sensors. In a CIP sensor, current flows from one side of the sensor to the other side parallel to the planes of the materials making up the sensor. Conversely, in a CPP sensor the sense current flows from the top of the sensor to the bottom of the sensor perpendicular to the plane of the layers of material making up the sensor.

The ever increasing demand for data storage density and data rate have increasingly pushed the limits of data storage designs. Recently in efforts to overcome such limits, engineers and scientists have focused on the use of perpendicular recording. In a perpendicular recording system a write pole emits a highly concentrated magnetic field that is directed perpendicular to the surface of the medium (eg. the disk). This field in turn magnetizes a localized portion of the disk in a direction perpendicular to the surface of the disk, thereby creating a bit of data. The resulting flux travels through the disk to a return path having a much larger area than the area in which the bit was recorded. The increased interest in perpendicular recording has lead to an increased interest in current perpendicular to plane (CPP) GMRs sensors, which are particularly suited to use in perpendicular recording.

Even with all of these advances, however, the need for greater bit density and increased data rate require ever improved sensor performance such as increased dr/R, the primary measure of magnetoresisitve sensor performance. Some researchers have found improved sensor performance by using Fe pinned layers with Cu spacers. The use of such materials however, has been limited to use in pinned layers however because when Fe is coupled with a Cu spacer, the Fe becomes magnetically very hard, having a very high coercivity. Such high coercivity (high Hc) has made use of these materials unsuitable for use in a free layer structure because the magnetization of the free layer would not be able to rotate freely in the presence of a magnetic field and the sensor would therefore have poor sensitivity.

As one can see, there remains a need for increasing the dr/R performance of a magnetoresistive sensor. Preferably such performance improvement would be implemented in a CPP GMR sensor, since these are the most desirable sensors for use in perpendicular recording.

SUMMARY OF THE INVENTION

The present invention provides a current perpendicular to plane (CPP) giant magnetoresistive sensor (GMR) having improved dr/R performance. The sensor includes a Cr space layer sandwiched between a pinned layer structure and a free layer structure. The free layer structure is a synthetic free layer including first and second magnetic layers separated by a Cr antiparallel coupling layer. The first magnetic layer of the free layer comprises Fe, and is located adjacent to the Cr spacer layer separating the free layer from the pinned layer. The second magnetic layer of the free layer structure comprises Fe, and N. The second magnetic layer even more preferably includes Fe, N and a material "X" where X could be for example Al or Ta.

The synthetic free layer advantageously allows a desirable Fe and Cr combination to be used while also allowing the free layer structure to remain magnetically soft. Although Fe when coupled with Cr (such as in the first magnetic layer) is magnetically very hard, the presence of N in the second magnetic layer makes the second magnetic layer very magnetically soft (ie. it has a low coercivity Hc). The Cr coupling layer separating the first and second magnetic layer is chosen to be of such a thickness that the first and second magnetic layers will be antiparallel coupled. Since these layers are antiparallel coupled, making the second magnetic layer magnetically soft makes the entire free layer structure soft.

Another advantage of constructing the free layer as an antiparallel coupled synthetic free layer is that the magnetic layer adjacent to the spacer layer can be made very thick. Our research has shown that in a CPP GMR design, dr/R increases with increasing thickness of the free layer adjacent to the spacer layer. However, in a simple free layer, making the free layer thicker increases the stiffness of the free layer to the point of rendering the free layer insensitive or inoperable. By constructing the free layer as an antiparallel coupled synthetic free layer, the layer adjacent to the spacer layer can be physically thick, while the effective magnetic thickness of entire free layer structure is small, the magnetic thickness being the difference between the magnetic thicknesses of the first and second magnetic layer of the free layer. This allows the sensor to exhibit the advantageous dr/R performance gain of a thick magnetic layer adjacent to the spacer layer while avoiding free layer stiffness.

As mentioned above the free layer can include a first magnetic layer comprising Fe, and can also include a second magnetic layer including FeXN, where X can be for example Al, or Ta. The amount of N need only be 2 to 5 percent N. The presence of the N in the second magnetic layer will make the second magnetic layer very magnetically soft, allowing the magnetization of the free layer to rotate freely in the presence of a magnetic field. In addition, the "X" element can be added to the second magnetic layer in order to provide negative magetostriction. As those skilled in the art will appreciate a near zero magnetostriction is desirable in the free layer. Unfortunately, the Fe first magnetic layer has a high positive magnetostriction, which when combined with the inevitable compressive stresses in the sensor will tend to orient the magnetization perpendicular to the ABS. In order to bring the magnetostriction of the entire free layer structure back to zero, or nearly so, the "X" element can be added to the second magnetic layer provide negative magnetostrictive properties. The amount of X can be varied as need to achieve the desired magnetostriction, but it is anticipated that the amount can be about 3 to 5 atomic percent.

In order to assure antiparallel coupling, a very thin layer of Fe may be added to the second magnetic layer at the location adjacent to the coupling layer separating the first and second magnetic layers of the free layer. Such a thin Fe layer may or may not be necessary, depending upon design parameters.

BRIEF DESCRIPTION OF THE DRAWINGS

For a fuller understanding of the nature and advantages of this invention, as well as the preferred mode of use, reference should be made to the following detailed description read in conjunction with the accompanying drawings.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
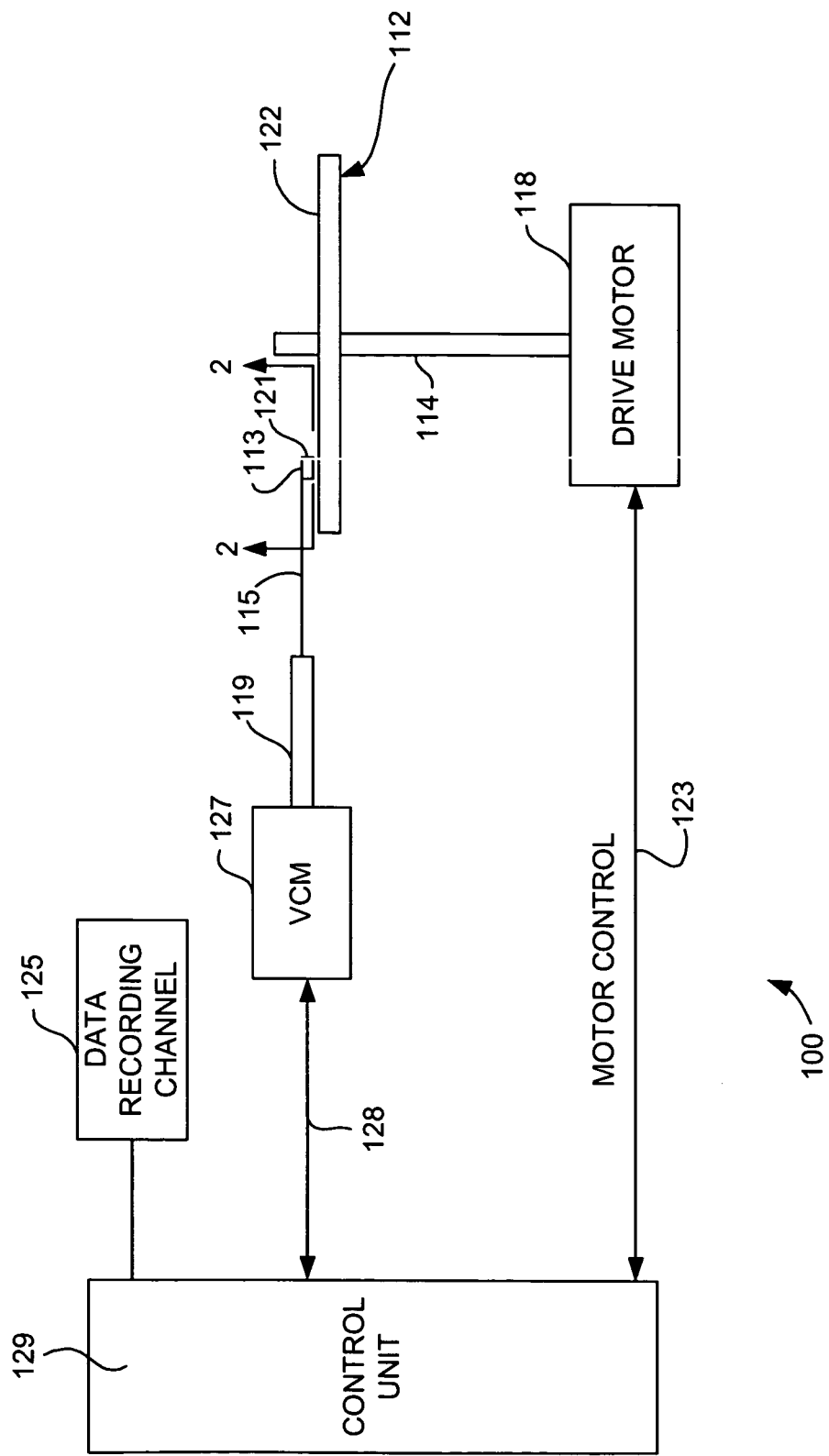
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
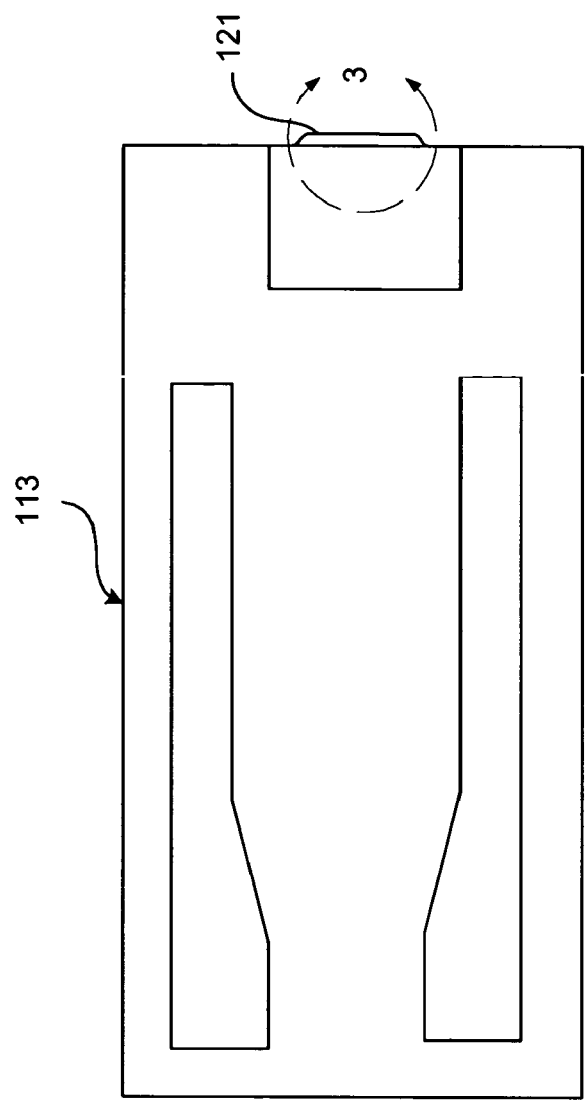
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
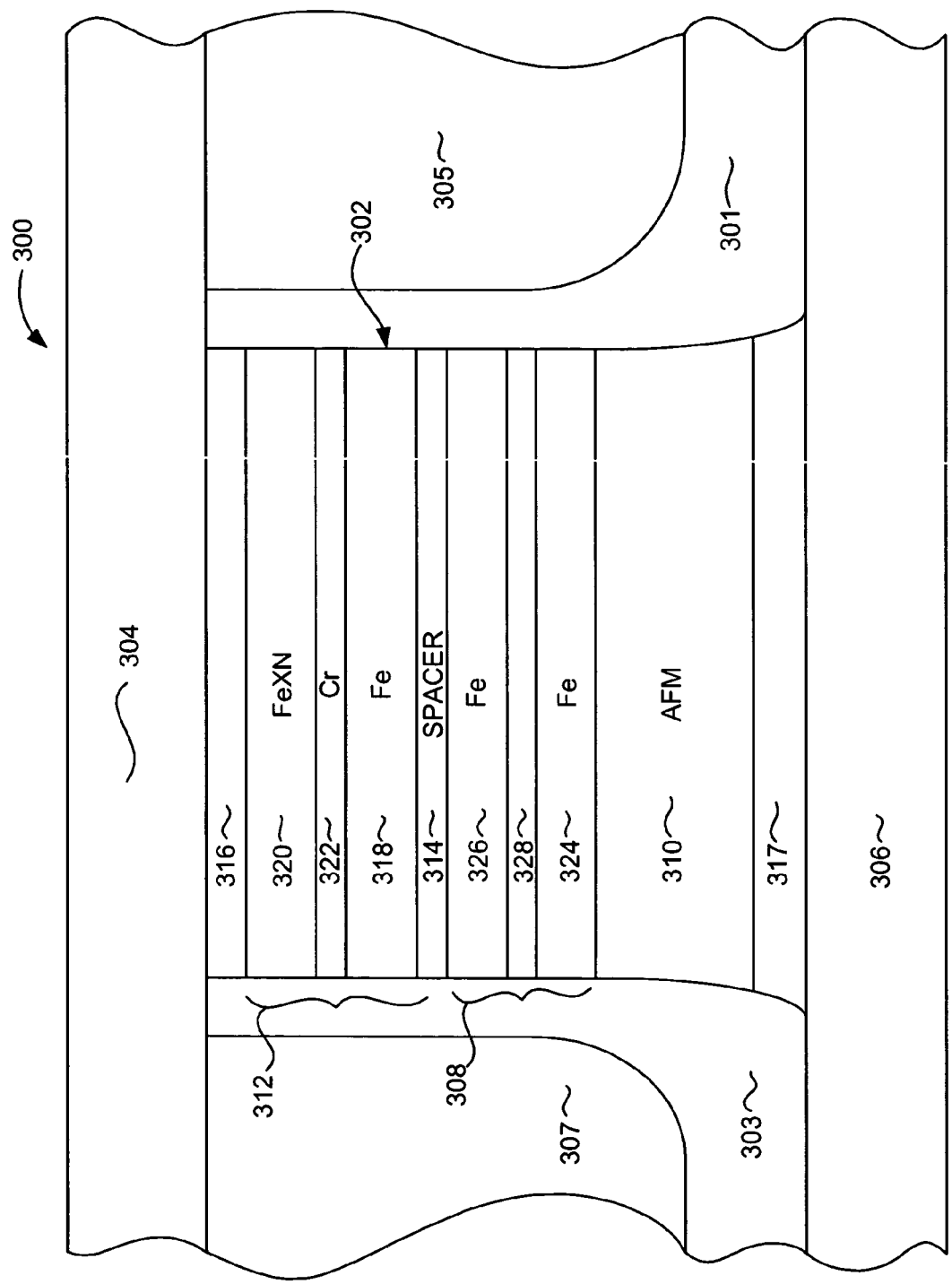
FIG. 3 is an ABS view of a magnetic sensor according to an embodiment of the present invention taken from circle 3 of FIG. 2.

With reference now to FIG. 3, the magnetic head 121 (FIG. 2) includes a magnetorsistive sensor 300 including a sensor stack 302 sandwiched between first and second electrical leads 304, 306 which also function as magnetic shields. The leads may be constructed of for example NiFe or another magnetic, electrically conductive material.

First and second laterally opposed insulation layers 301, 303 are provided at either lateral side of the sensor stack 302. In addition, first and second hard bias layers 305, 307, constructed of a magnetically hard material such as CoPt are provided at either side, and extend laterally outward from the insulation layers 301, 303. The hard bias layers 305, 307 provide magnetic biasing to maintain the free layer biased parallel to the ABS as desired. The insulation layers 301, 303 prevent sense current from being shunted across the hard bias layers 305, 307.

The sensor stack 302 includes a magnetic pinned layer 308, which may or may not be pinned by exchange coupling with a layer of antiferromagnetic material (AFM layer) 310, and a free layer 312. An electrically conductive, non-magnetic spacer layer 314, preferably constructed of Cr is sandwiched between the pinned and free layers 308, 312. In addition, a capping layer 316 such as for example Ta, Ru or another suitable material may be provided at the top of the sensor stack 302 to protect the sensor materials from damage, such as by corrosion, during manufacture. One or more seed layers 317 may be provided at the bottom of the sensor stack 302. The seed layers may be constructed of, for example, Ta/NiFeCr, Ru, Ru/Ta or some other material having a desired crystallographic structure in order to ensure a desired structure in the subsequently deposited layers of the stack 302.

With continued reference to FIG. 3, the free layer of the present invention includes a synthetic free layer structure having a first magnetic layer 318, a second magnetic layer 320 and a non-magnetic, electrically conductive Cr coupling layer 322 sandwiched there between. The Cr layer is constructed of a thickness so as to antiparallel couple the magnetizations of the first and second magnetic layers 318, 320. To this end, the coupling layer can be about 9 to 13 Angstroms thick.

The first magnetic layer 318 of the free layer structure 312 is constructed primarily or completely of Fe, whereas the second magnetic layer is constructed of FeXN, where X can be Al or Ta. The amount of X in the second magnetic layer 320 may be only about 3 to 5 atomic percent. The amount of N in the second magnetic layer 320 may be only about 2 to 5 atomic percent. The amount of X added to the second magnetic layer can be adjusted as need to provide a desirable near zero magnetostriction for the free layer structure 312.

With reference still to FIG. 3, the first magnetic layer 318 of the free layer structure 312 is preferably thicker than the second magnetic layer 320, and may be about twice as thick as the second magnetic layer. For example, the first magnetic layer 318 might be about 60 Angstroms thick, whereas the second magnetic layer 320 might be 30 Angstroms thick. This provides beneficial large physical thickness of the first magnetic layer (ie adjacent to the spacer layer) for increased dr/R, while still allowing the overall magnetic thickness of the free layer structure to be only the difference between the first and second magnetic layers 318, 320. As discussed above, this smaller total magnetic thickness provided by antiparallel coupling the first and second magnetic layers 318, 320 allows the free layer to remain magnetically soft and allows the magnetization of the free layer 312 to be able to rotate in the presence of a magnetic field.

With further reference to FIG. 3, the pinned layer structure also includes first and second magnetic layers 324, 326 separated by a non-magnetic, electrically conductive spacer coupling layer 328. The first and second magnetic layers are preferably constructed of Fe. The coupling layer is preferably constructed of Cr, and is formed of a thickness so as to antiparallel couple the magnetizations of the first and second magnetic layers 324, 326. This thickness of the coupling layer 328 may be about 9 to 13 Angstroms. The ferromagnetic layers 324, 326 of the pinned layer 308 preferably have thicknesses that are very close to one another, and may be about 30 Angstroms each.

Figure 4:
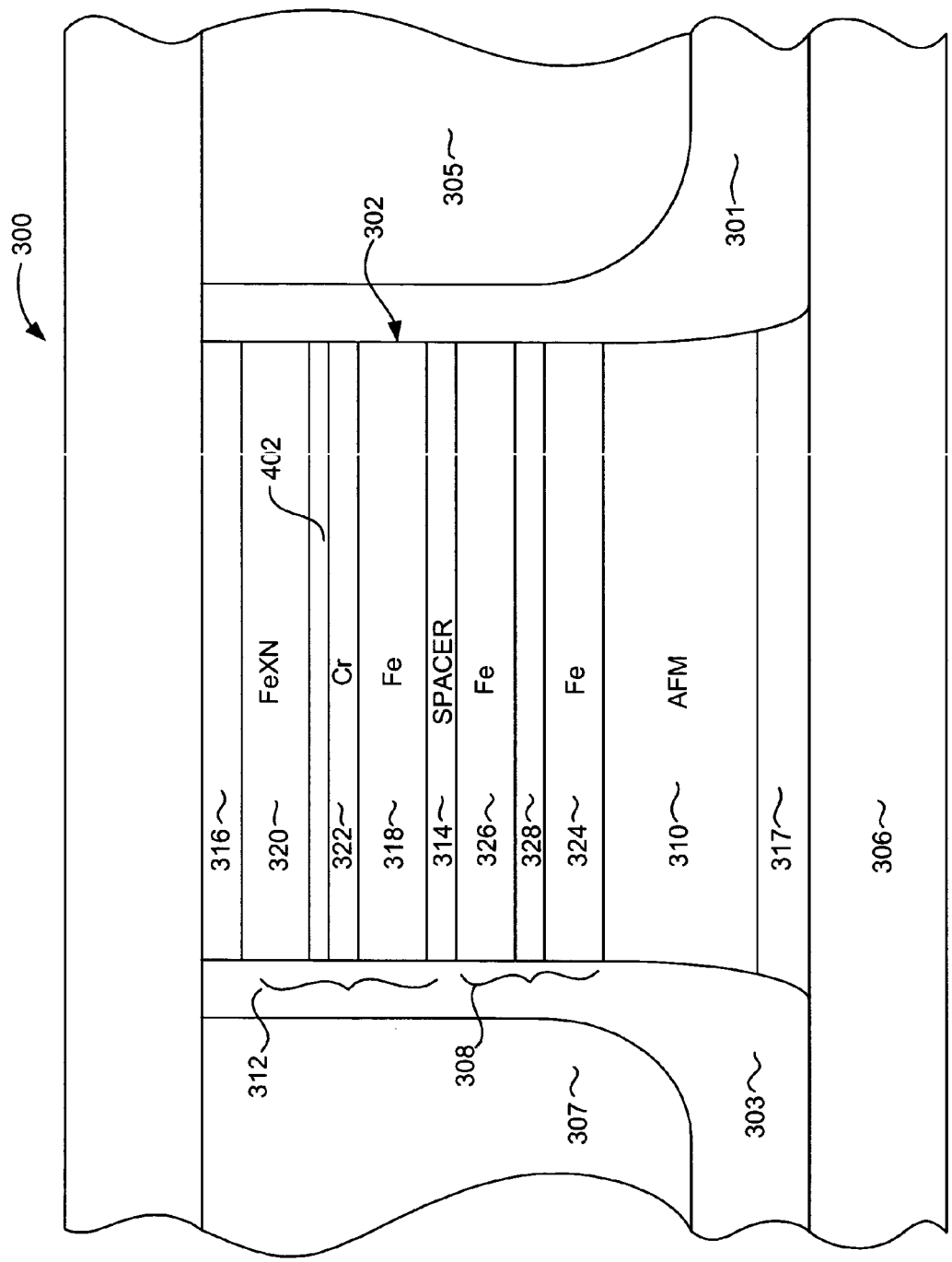
FIG. 4 is an ABS view of an alternate embodiment of a sensor according to an embodiment of the present invention.

With reference now to FIG. 4, a thin layer 402 of Fe may be added to the second magnetic layer 320 of the free layer 312. The thin layer of Fe is located adjacent to the coupling layer 322 and could be useful in facilitating coupling of the second magnetic layer 320 with the coupling layer 322. This layer 402 can be constructed very thin and may only be on the order of several Angstroms.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A current perpendicular to plane (CPP) giant magnetoresistive (GMR) sensor, comprising:
    a pinned layer structure;
    a synthetic free layer structure; and
    a spacer layer sandwiched between said pinned layer structure and said synthetic free layer structure, said free layer structure further comprising:
        a first magnetic layer comprising Fe;
        a second magnetic layer comprising Fe and N; and
        a coupling layer comprising Cr sandwiched between said first and second magnetic layers;
    wherein said second magnetic layer of said free layer comprises 2 to 5 atomic percent N.

2. A sensor as in claim 1, wherein said first magnetic layer is disposed closer to said spacer layer than said second magnetic layer and wherein said first magnetic layer is thicker than said second magnetic layer.

3. A sensor as in claim 1, wherein said first magnetic layer is disposed closer to said spacer layer than said second magnetic layer and wherein said first magnetic layer is about twice as thick as said second magnetic layer.

4. A sensor as in claim 1, wherein said first magnetic layer is disposed closer to said spacer layer than said second magnetic layer, and wherein said first magnetic layer has a thickness of about 60 Angstroms and said second magnetic layer has a thickness of about 30 Angstroms.

5. A sensor as in claim 1, wherein said spacer layer comprises Cr.

6. A sensor as in claim 1, wherein said spacer layer comprises Cr and has a thickness of 20 to 40 Angstroms.

7. A sensor as in claim 1 wherein said pinned layer structure comprises third magnetic layer comprising Fe, a fourth magnetic layer comprising Fe, and a second coupling layer comprising Cr.

8. A sensor as in claim 7 wherein said second coupling, layer has a thickness of 9 to 13 Angstroms.

9. A sensor as in claim 7 wherein one of said third and fourth magnetic layers has a thickness of about 30 Angstroms.

10. A sensor as in claim 1, wherein:
said pinned layer structure comprises a third magnetic layer comprising Fe, a fourth magnetic layer comprising Fe, and a second coupling layer comprising Cr; and
said spacer layer comprises Cr.

11. A current perpendicular to plane (CPP) giant magnetoresistive (GMR) sensor, comprising:
a pinned layer structure;
a synthetic free layer structure; and
a spacer layer sandwiched between said pinned layer structure and said synthetic free layer structure, said free layer structure further comprising:
a first magnetic layer comprising Fe;
a second magnetic layer comprising Fe and N, and X, where X is selected from the group of materials consisting of Al, and Ta;
a coupling layer comprising Cr sandwiched between said first and second magnetic layers;
wherein said second magnetic layer of said free layer comprises 1 to 3 atomic percent X.

12. A sensor as in claim 11 wherein said spacer layer comprises Cr.

13. A sensor as in claim 11 wherein said pinned layer structure comprises a third magnetic layer comprising Fe, a fourth magnetic layer comprising Fe, and a second coupling layer comprising Cr, said second coupling layer being sandwiched between said third and fourth magnetic layers.

14. A sensor as in claim 13 wherein said second coupling layer has a thickness of 9 to 13 Angstroms.

15. A sensor as in claim 11, wherein:
said pinned layer structure comprises a third magnetic layer comprising Fe, a fourth magnetic layer comprising Fe, and a second coupling layer comprising Cr; and
said spacer layer comprises Cr.

16. A sensor as in claim 15 wherein one of said third and fourth magnetic layers has a thickness of about 30 Angstroms.

17. A current perpendicular to plane (CPP) giant magnetoresistive (GMR) sensor, comprising:
a pinned layer structure;
a synthetic free layer structure; and
a spacer layer sandwiched between said pinned layer structure and said synthetic free layer structure, said free layer structure further comprising:
a first magnetic layer comprising Fe;
a second magnetic layer comprising Fe and N; and
a coupling layer comprising Cr sandwiched between said first and second magnetic layers;
wherein said second magnetic layer further comprises a thin layer consisting essentially of Fe adjacent to said coupling layer.

18. A current perpendicular to plane (CPP) giant magnetoresistive (GMR) sensor, comprising:
a pinned layer structure;
a synthetic free layer structure; and
a spacer layer sandwiched between said pinned layer structure and said synthetic free layer structure, said free layer structure further comprising:
a first magnetic layer comprising Fe;
a second magnetic layer comprising Fe, N and X where X comprises a material selected from the group consisting of Al and Ta; and
a coupling layer comprising Cr sandwiched between said first and second magnetic layers;
wherein said second magnetic layer further comprises a thin layer consisting essentially of Fe adjacent to said coupling layer.

19. A magnetic data storage system, comprising:
a magnetic media;
an actuator;
a slider connected with said actuator for movement adjacent to said magnetic media;
a current perpendicular to plane (CPP) giant magnetoresistive (GMR) sensor connected with said slider, said sensor comprising:
a pinned layer structure;
a synthetic free layer structure; and
a spacer layer comprising Cr sandwiched between said pinned layer structure and said synthetic free layer structure, said free layer structure further comprising:
a first magnetic layer comprising Fe;
a second magnetic layer comprising Fe and N; and
a coupling layer comprising Cr sandwiched between said first and second magnetic layers;
wherein the second magnetic layer comprises 2-5 atomic percent N; and
said pinned layer structure further comprising:
a third magnetic layer comprising Fe;
a fourth magnetic layer comprising Fe; and
a second coupling layer comprising Cr.

* * * * *

UNITED STATES PATENT AND TRADEMARK OFFICE
CERTIFICATE OF CORRECTION

PATENT NO. : 7,352,541 B2  
APPLICATION NO. : 10/837358  
DATED : April 1, 2008  
INVENTOR(S) : Gill Page 1 of 1

It is certified that error appears in the above-identified patent and that said Letters Patent is hereby corrected as shown below:

In claim 7, column 7, line 4, insert --a-- between "comprises" and "third".

Signed and Sealed this

Twenty-seventh Day of July, 2010

David J. Kappos
*Director of the United States Patent and Trademark Office*